United States Patent
Kamiya

(10) Patent No.: US 10,712,767 B2
(45) Date of Patent: Jul. 14, 2020

(54) CLOCK GENERATOR AND CLOCK GENERATION METHOD

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventor: Satoshi Kamiya, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 149 days.

(21) Appl. No.: 15/902,555

(22) Filed: Feb. 22, 2018

(65) Prior Publication Data
US 2019/0086949 A1    Mar. 21, 2019

(30) Foreign Application Priority Data
Sep. 20, 2017 (JP) .................. 2017-179976

(51) Int. Cl.
| G06F 1/08 | (2006.01) |
| G06F 1/324 | (2019.01) |
| G06F 1/025 | (2006.01) |
| G06F 1/3206 | (2019.01) |
| H03K 23/66 | (2006.01) |
| G06F 1/3225 | (2019.01) |
| G06F 1/10 | (2006.01) |
| G06F 1/20 | (2006.01) |
| H03K 21/38 | (2006.01) |
| G11C 7/22 | (2006.01) |

(52) U.S. Cl.
CPC ............... *G06F 1/08* (2013.01); *G06F 1/025* (2013.01); *G06F 1/10* (2013.01); *G06F 1/206* (2013.01); *G06F 1/324* (2013.01); *G06F 1/3206* (2013.01); *G06F 1/3225* (2013.01); *G11C 7/222* (2013.01); *H03K 21/38* (2013.01); *H03K 23/662* (2013.01)

(58) Field of Classification Search
CPC ........................................................ G06F 1/08
See application file for complete search history.

(56) References Cited

U.S. PATENT DOCUMENTS

| 5,319,771 A | 6/1994 | Takeda |
| 2004/0000939 A1 | 1/2004 | Meguro |
| 2007/0006006 A1 | 1/2007 | Henson |
| 2008/0061855 A1* | 3/2008 | Cha .......................... H03K 3/84 327/291 |
| 2011/0106992 A1 | 5/2011 | Lee et al. |

(Continued)

FOREIGN PATENT DOCUMENTS

| JP | 03087909 A | 4/1991 |
| JP | 2002043901 A | 2/2002 |

(Continued)

*Primary Examiner* — Albert Wang
(74) *Attorney, Agent, or Firm* — Holtz, Holtz & Volek PC

(57) ABSTRACT

According to one embodiment, there is provided a clock generator including a frequency divider configured to generate a divided frequency clock of a frequency lower than that of a source clock by performing mask processing on part of a pulse train of the source clock.

10 Claims, 13 Drawing Sheets

(56) References Cited

U.S. PATENT DOCUMENTS

| | | |
|---|---|---|
| 2011/0222644 A1* | 9/2011 | Shibayama ............... G06F 1/08 377/48 |
| 2011/0248762 A1 | 10/2011 | Minaki |
| 2014/0015567 A1 | 1/2014 | Kadosh et al. |
| 2017/0063088 A1 | 3/2017 | Wang et al. |

FOREIGN PATENT DOCUMENTS

| | | | |
|---|---|---|---|
| JP | 2003330569 | A | 11/2003 |
| JP | 2011221711 | A | 11/2011 |
| KR | 20070001786 | A | 1/2007 |

* cited by examiner

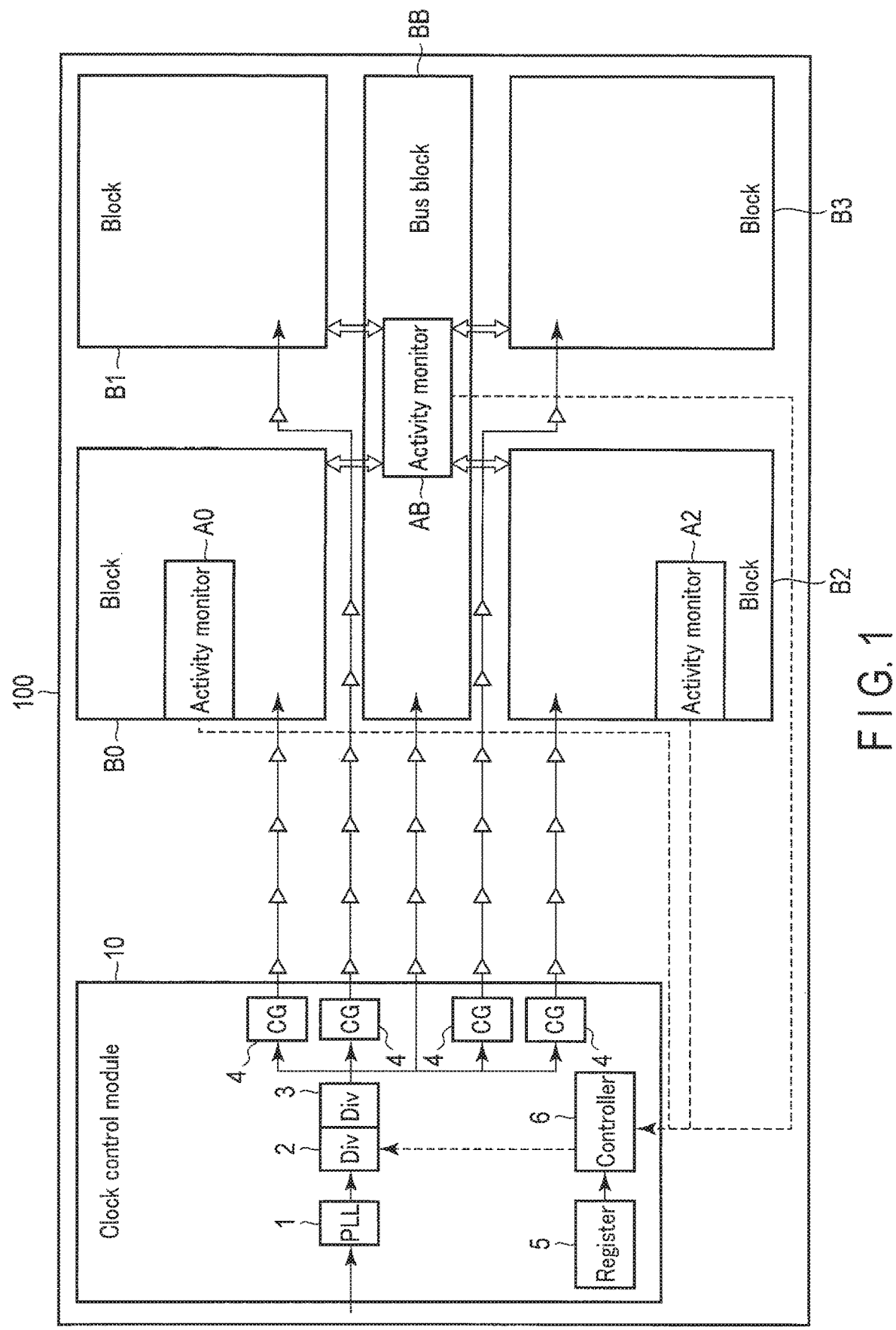
F I G. 1

| Number of masks | Clock Pulse Pattern (0:Mask, 1:Pulse) |
|---|---|
| 0x00 | 11111111111111111111111111111111 |
| 0x01 | 01111111111111111111111111111111 |
| 0x02 | 01111111111111101111111111111111 |
| 0x03 | 01111111110111111111011111111111 |
| 0x04 | 01111110111111011111101111111 |
| 0x05 | 01111101111110111110111110111111 |
| 0x06 | 01111011110111101111011110111111 |
| 0x07 | 01111011101110110111101110111 |
| 0x08 | 01110111011101110111011101110111 |
| 0x09 | 01101110110111011101101101110111 |
| 0x0a | 01101101101101100110110110110111 |
| 0x0b | 01101101101101101101101101101101 |
| 0x0c | 01101101011011010110110101101101 |
| 0x0d | 01101101011010101101101011010101 |
| 0x0e | 01101010110101011010101101010101 |
| 0x0f | 01010101101010101011010101010101 |
| 0x10 | 01010101010101010101010101010101 |
| 0x11 | 10101010100101010101001010101010 |
| 0x12 | 10010101001010100101010010101010 |
| 0x13 | 10010010100101010010101001001010 |
| 0x14 | 10010010100100101001001010010010 |
| 0x15 | 10010010010010010010010010010010 |
| 0x16 | 10010010010010010010010010001000 |
| 0x17 | 10010001000100010001000100100100 |
| 0x18 | 10001000100010001000100010001000 |
| 0x19 | 10000100010001000100001000010000 |
| 0x1a | 10000100001000010000100001000000 |
| 0x1b | 10000010000001000001000000100000 |
| 0x1c | 10000000100000001000000010000000 |
| 0x1d | 10000000001000000000010000000000 |
| 0x1e | 10000000000000010000000000000000 |
| 0x1f | 10000000000000000000000000000000 |

FIG. 3

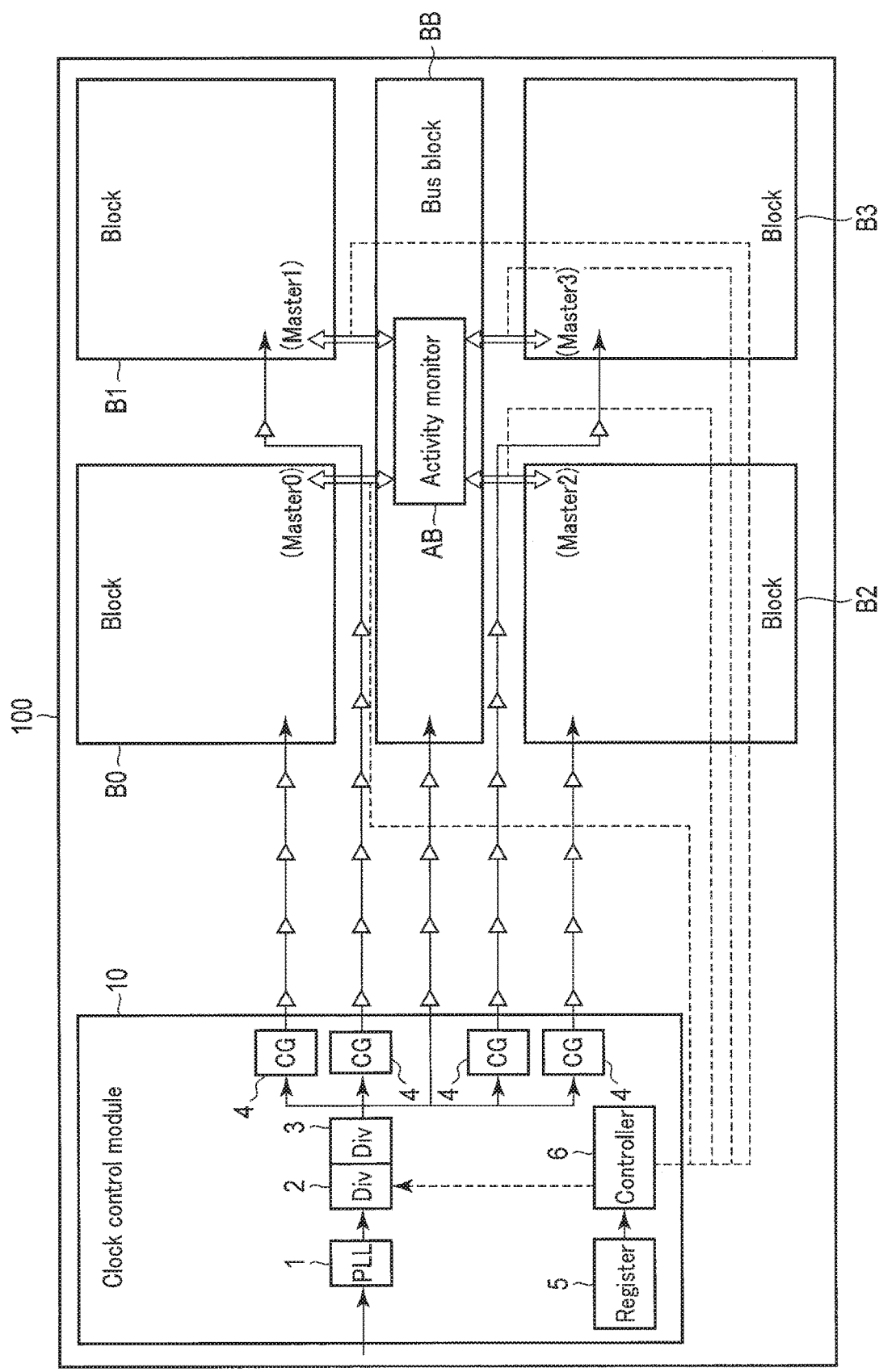
F I G. 6

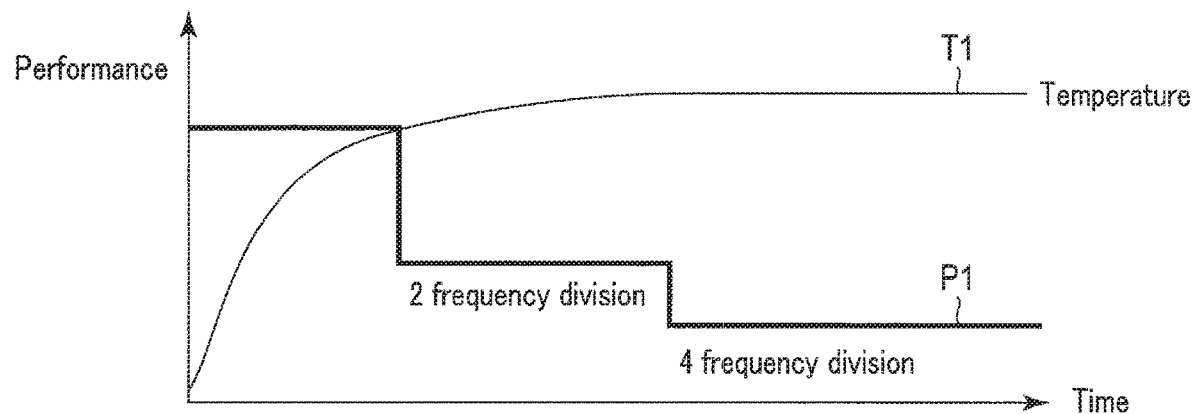
F I G. 11A
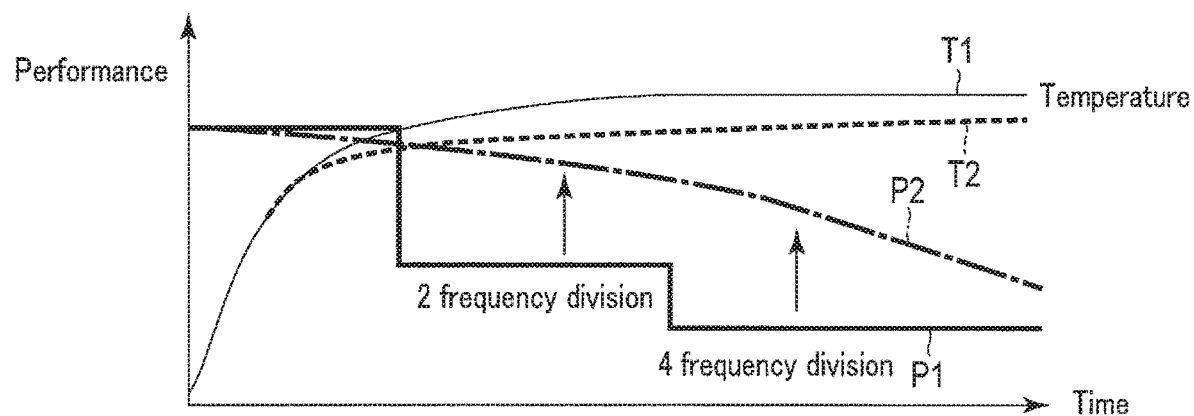
F I G. 11B

CLOCK GENERATOR AND CLOCK GENERATION METHOD

CROSS-REFERENCE TO RELATED APPLICATIONS

This application is based upon and claims the benefit of priority from Japanese Patent Application No. 2017-179976, filed Sep. 20, 2017, the entire contents of which are incorporated herein by reference.

FIELD

Embodiments described herein relate generally to a clock generator and a clock generation method.

BACKGROUND

To reduce power during operation of circuits of a computer, semiconductor or the like, a method of controlling the clock to necessary and sufficient frequencies is known. The clock frequency is raised for processing that needs a fixed level of performance or more or high-load processing to avoid damaging a function. Conversely, the clock frequency is lowered to reduce power during operation for processing that does not need performance or low-load processing.

If any operating condition such as the temperature or the maximum current amount permitted by a circuit is set, the control to lower the clock frequency is exercised for operation within the range of the operating condition. In such a case, however, performance is sacrificed and it becomes difficult to satisfy the function that should originally be provided.

In general, to control the clock frequency, a method of generating a plurality of clocks in advance and switching the clock or a method of exercising setting change control of a clock generator such as a phase locked loop (PLL) or a frequency division circuit capable of taking a plurality of division ratios is adopted. In this case, problems such as the switching time of clock, area overheads of a circuit and the like arise.

If it takes time to switch the clock, an operation at an optimum clock frequency cannot be performed. For example, wasteful power is consumed by an operation on a high-frequency clock in a period in which a low-frequency operation is allowed. Conversely, a low-frequency clock is supplied in a period in which an operation at high frequencies is required, inviting lower performance.

Compared with other blocks, a clock generator is a block of high operation rate and when area overheads arise, the overheads could become a factor that prevents an originally intended reduction of power from being achieved.

BRIEF DESCRIPTION OF THE DRAWINGS

FIG. 1 is a conceptual diagram showing an example of a basic configuration of a semiconductor device according to each embodiment;

FIG. 3 is a diagram showing an example of a table in which a plurality of clock pulse patterns stored in a predetermined memory unit of the clock pulse pattern generator shown in FIG. 2 is defined;

FIG. 6 is a conceptual diagram showing an example of the configuration of the semiconductor device according to a first embodiment;

FIGS. 11A and 11B are conceptual diagrams showing temperature changes and performance changes implemented by differences between the control according to the third embodiment and control by general technology in comparison.

DETAILED DESCRIPTION

Figure 2:
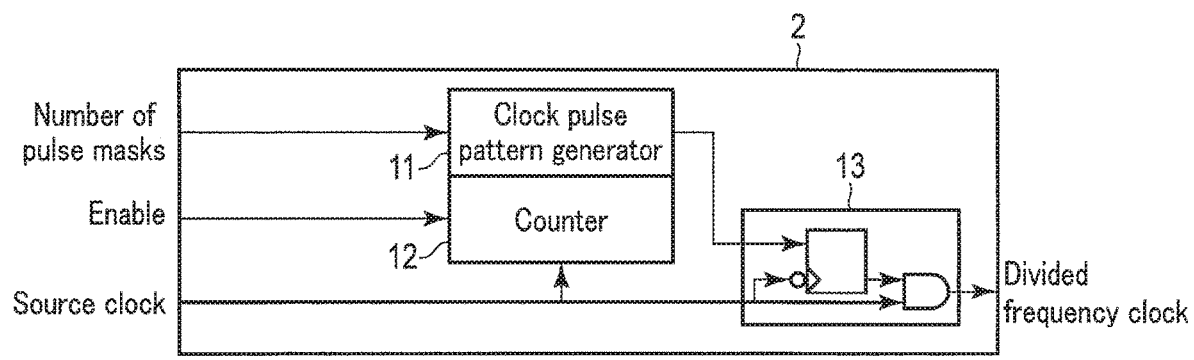
FIG. 2 is a circuit diagram showing an example of a circuit configuration of a pulse masking type frequency divider.

Hereinafter, embodiments will be described with reference to the drawings.

In general, according to one embodiment, there is provided a clock generator including a frequency divider configured to generate a divided frequency clock of a frequency lower than that of a source clock by performing mask processing on part of a pulse train of the source clock.

Common to Each Embodiment

First, matters common to each embodiment will be described.

A clock generator shown in each embodiment is applied to circuits operating on a clock including computers and semiconductors and allows to generate an optimum clock pulse fitted to respective systems and use cases when implementing operations under, for example, dynamic frequency scaling (DFS) control, which is a technology for dynamic power reduction, or various conditions. More specifically, a frequency divider (a pulse masking type frequency divider described below) having a specific function is used and mask processing is performed on part of a pulse train of the source clock to be able to generate a divided frequency clock of a frequency lower than that of the source clock. The mask processing can be performed in units of clock cycle (in units of pulse) at a minimum to be able to implement finer frequency control.

FIG. 1 is a conceptual diagram showing an example of a basic configuration of a semiconductor device according to each embodiment.

As shown in FIG. 1, in a semiconductor device 100, a clock control module 10, a bus block BB, and a plurality of function blocks including blocks B0, B1, B2, and B3 are arranged.

The clock control module 10 includes a clock generator that generates a clock to be supplied to each unit. The blocks B0, B1, B2, and B3 are each function blocks that operate using the clock supplied from the clock control module 10. The bus block BB includes a bus that operates using the clock supplied from the clock control module 10.

The semiconductor device 100 includes an activity monitor (namely, condition monitoring circuit) that detects some condition of a certain object if necessary. For example, as shown in FIG. 1, an activity monitor AB may be included in the bus block BB or an activity monitor (for example, an activity monitor A0 or an activity monitor A2) may be included in all or a portion (for example, the block B0 or the block B2) of the blocks B0, B1, B2, and B3.

The activity monitor AB may be configured to, for example, monitor for any occurrence of bus access (transaction) of each of the blocks B0, B1, B2, and B3 to the bus block BB.

The activity monitor A0 or the activity monitor A2 may be configured to, for example, monitor an available capacity of a memory such as FIFO or the like that sends data to a predetermined device, or may be configured to monitor the temperature of a predetermined location, or may be configured to monitor the state transition between a plurality of operation modes of different power consumption.

The clock control module 10 includes a PLL circuit 1, frequency dividers 2 and 3, a clock gating circuit 4, a register 5, and a controller (control circuit) 6. However, components of the clock control module 10 are not limited to the above components. The configuration may appropriately be changed such as omitting a portion of the components, for example, the installation of the frequency divider 3.

The PLL circuit 1 outputs a clock signal in which phases are adjusted. The frequency dividers 2 and 3 output a clock signal whose frequency is lowered from the frequency of a clock signal (source clock) supplied from the PLL circuit 1. The clock gating circuit 4 performs clock gating on a clock signal supplied from the frequency dividers 2 and 3. A clock signal on which clock gating is performed is supplied to each of the blocks B0, B1, B2, and B3.

At least the frequency divider 2 of the frequency dividers 2 and 3 is a pulse masking type frequency divider having a function to generate a divided frequency clock of a frequency lower than that of the source clock by performing mask processing on part of a pulse train of the source clock.

More specifically, the pulse masking type frequency divider 2 has a function to generate a divided frequency clock of a frequency lower than that of the source clock by using a bit string pattern (hereinafter, called a "clock pulse pattern") that masks part of a pulse train of the source clock. The clock pulse pattern defines in which timing to mask a pulse train of the source clock and in which timing to output the pulse train.

The pulse masking type frequency divider 2 also has a function to switch the clock pulse pattern to switch the frequency of a divided frequency clock to be generated by being controlled by predetermined hardware (for example, the controller 6). More specifically, the pulse masking type frequency divider 2 has a function to selectively generate one of a plurality of divided frequency clocks of different frequencies by selectively using one of a plurality of clock pulse patterns prepared in advance.

The register 5 stores various kinds of information used by the controller 6 to control the pulse masking type frequency divider 2.

The controller 6 controls the pulse masking type frequency divider 2 by sending a signal for control to the pulse masking type frequency divider 2. The controller 6 can change the frequency of a divided frequency clock generated by the pulse masking type frequency divider 2 in accordance with, for example, the state of a predetermined object obtained from activity monitors (for example, the activity monitors AB, A0, and A2) included in the semiconductor device 100.

A clock output from the pulse masking type frequency divider 2 is output from the clock control module 10 via, if necessary, the frequency divider 3 or the clock gating circuit 4 before being supplied to individual blocks.

FIG. 2 is a circuit diagram showing an example of a circuit configuration of the pulse masking type frequency divider 2.

The pulse masking type frequency divider 2 includes a clock pulse pattern generator 11, a counter 12, and a clock gating unit 13. Also, the pulse masking type frequency divider 2 includes a terminal to input the source clock supplied from the PLL 1 side, a terminal to input each signal for control supplied from the controller 6 (such as a signal instructing the number of pulse masks described below and an enable signal), and a terminal to output a divided frequency clock generated.

The clock pulse pattern generator 11 selects a relevant clock pulse pattern among a plurality of clock pulse patterns stored in a predetermined memory unit in advance in accordance with the number of pulse masks specified by the controller 6 and outputs a bit string of the selected clock pulse pattern. The bit string of a clock pulse pattern indicates that a predetermined pulse is masked by, for example, "0" and a predetermined pulse is not masked by "1".

The counter 12 counts pulses of the source clock and also detects ON/OFF of the enable signal. Information obtained by the counter 12 is transmitted to the clock pulse pattern generator 11. Accordingly, the clock pulse pattern generator 11 can start bit string output of a clock pulse pattern in accordance with the enable signal or output the bit string of a clock pulse pattern in synchronization with the source clock. That is, the counter 12 causes the clock pulse pattern generator 11 to send out the bit string of one clock pulse pattern to the clock gating unit 13 in a fixed cycle.

The clock gating unit 13 inputs the source clock and also inputs the it string of a clock pulse pattern sent from the clock pulse pattern generator 11 to output the pulse string of the source clock by masking a portion thereof according to the bit string of the clock pulse pattern. That is, the clock gating unit 13 performs processing to mask the source clock for each mask and processing to output directly without masking according to the bit string of a clock pulse pattern. As a result, a divided frequency clock in which mask processing is performed on the source clock or a clock in which no mask processing is performed is output from the clock gating unit 13.

The pulse masking type frequency divider 2 shown in FIG. 2 can be implemented only by incorporating a predetermined gating mechanism into an existing clock line.

Incidentally, the configuration of the pulse masking type frequency divider 2 shown in FIG. 2 is not limited to the above example. If the same function can be implemented, another configuration may also be adopted.

FIG. 3 is a diagram showing an example of a table in which a plurality of clock pulse patterns stored in a predetermined memory unit of the clock pulse pattern generator 11 shown in FIG. 2 is defined.

In the example of FIG. 3, 32 clock cycles (32 pulses) in the source clock are set as a unit. However, the unit of a clock pulse pattern is not limited to the above example.

Instead of 32, any number such as 16 or 64 may be adopted in accordance with the system or use case as the number of clock cycles (pulses) to be a unit.

In FIG. 3, examples of 32 clock pulse patterns in accordance with the number of pulse masks are shown.

Each clock pulse pattern defines which pulse of 32 clock cycles to mask and which pulse to output without masking. "0" indicates that a pulse is to be masked and "1" indicates that a pulse is to be output without masking.

The table shown in FIG. 3 can define a plurality of desired mask patterns by fitting to specifications or restrictions of a product.

Figure 4:
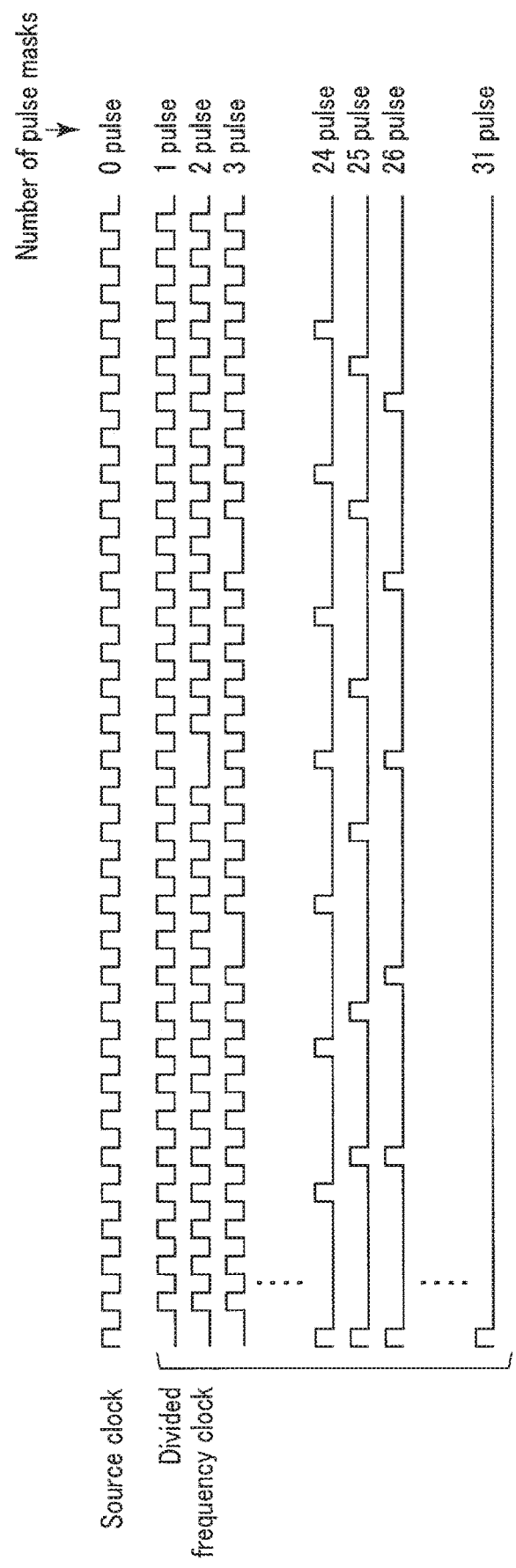
FIG. 4 is a timing chart showing relationships between various divided frequency clocks and a source clock.

FIG. 4 is a timing chart showing relationships between various divided frequency clocks and a source clock.

In FIG. 4, examples of clocks corresponding to the plurality of clock pulse patterns shown in the table of Example 3 are shown respectively. More specifically, an example of the source clock in which the number of pulse masks is 0 and examples of 31 divided frequency clocks in accordance with the number of pulse masks are shown.

As shown in examples of the divided frequency clocks in FIG. 4, a pulse of the source clock is masked in timing of "0" of the clock pulse pattern of FIG. 3 and a pulse of the source clock is output-without masking in timing of "1" of the clock pulse pattern of FIG. 3.

As is evident from the examples of FIG. 4, with an increasing number of masks specified by the controller 6, the number of pulses to be thinned out increases and the clock frequency decreases.

Figure 5:
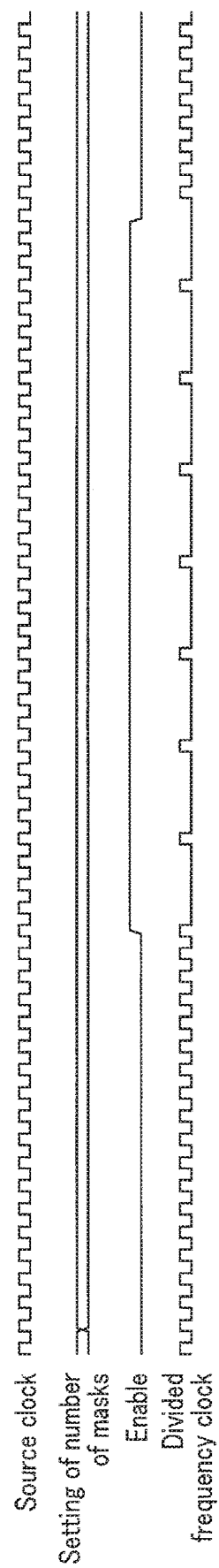
FIG. 5 is a timing chart showing an example of an operation in which a divided frequency clock mask-processed in accordance with a setting of the number of masks for the source clock and ON/OFF of an enable signal is formed.

FIG. 5 is a timing chart showing an example of an operation in which a divided frequency clock mask-processed in accordance with a setting of the number of masks for the source clock and ON/OFF of an enable signal is formed.

The example of FIG. 5 shows a case in which the number of masks is 24. If, after the number of masks is set to 24, an enable signal is set to an ON state, the pulse train of the source clock is partially masked at fixed periods by the bit string of the clock pulse pattern corresponding to the set number of masks immediately (for example, after a few cycles). As a result, a divided frequency clack that had the same frequency as the source clock now has a lower frequency. Then, when the enable signal is set to an OFF state, the relevant mask processing is canceled immediately (for example, after a few cycles) to restore the frequency of the divided frequency clock to its original state.

Incidentally, the operation to form a divided frequency clock is not limited to the example of FIG. 5. For example, the enable signal is not necessarily needed and a similar operation can also be implemented without using the enable signal. In such a case, instead of switching the number of masks using the time when the enable signal is set to the ON state as the reference, the number of masks may be switched using the time when the number of masks is set as the reference.

The pulse masking type frequency divider 2 described above is not limited to the example of the semiconductor device 100 in FIG. 1 and enables easy incorporation into all kinds of devices and systems.

Because the configuration in which the pulse masking type frequency divider 2 is controlled from hardware is adopted, when a signal specifying a new clock frequency is received, the pulse masking type frequency divider 2 can generate the specified frequency immediately. Quick switching of the frequency is enabled and so losses of power consumption in a switching period of frequency can be reduced. In addition, the specified frequency can immediately be generated just after a signal specifying a new clock frequency is received and thus the desired performance can be immediately delivered.

The dynamic control such as clock gating requires that a control signal should be enabled in one cycle, but in control using the pulse masking type frequency divider 2, a clock pulse pattern in accordance with needed performance can arbitrarily be set and so the control in one cycle is not necessarily needed.

In addition to control by the hardware, control by software can be added by fitting to each of systems and use cases.

The clock pulse pattern can arbitrarily be selected and the control can be made easier by presetting which clock pulse pattern to select in accordance with each use case.

First Embodiment

Next, a first embodiment will be described.

The first embodiment will be described with reference to FIGS. 6 and 7.

FIG. 6 is a conceptual diagram showing an example of the configuration of the semiconductor device according to the first embodiment. The same reference signs are attached to elements common to those in FIG. 1 to omit a duplicate description.

As shown in FIG. 6, an activity monitor AB is included in a bus block BB. The activity monitor AB monitors, for example, for any occurrence of each transaction from the blocks B0, B1, B2, and B3 to the bus block BB. Incidentally, each of the blocks B0, B1, B2, and B3 operates as a bus master (master module) and the bus block BB operates as a bus body that transmits signals exchanged between the bus master and slaves (not shown). That is, the activity monitor AB monitors signals exchanged between the bus master and slaves to determine whether each transaction occurs. Hereinafter, the blocks B0, B1, B2, and B3 may be called Master0, Master1, Master2, and Master3 respectively. Information monitored by the activity monitor AB is always transmitted to the controller 6.

The controller 6 changes the number of masks of pulses masked by the pulse masking type frequency divider 2 in accordance with the occurrence of each transaction shown in information transmitted from the activity monitor AB to change the frequency of a divided frequency clock generated by the pulse masking type frequency divider 2. Here, the controller 6 is assumed to monitor, for example, Master0, Master1, and Master2.

In the register 5, information specifying the status of transaction of which block to use for DFS control is stored. Here, it is assumed that information specifying that the status of each transaction of, for example, Master0, Master1, and Master2 are used for DFS control is stored. The information stored in the register 5 is referenced by the controller 6.

Figure 7:
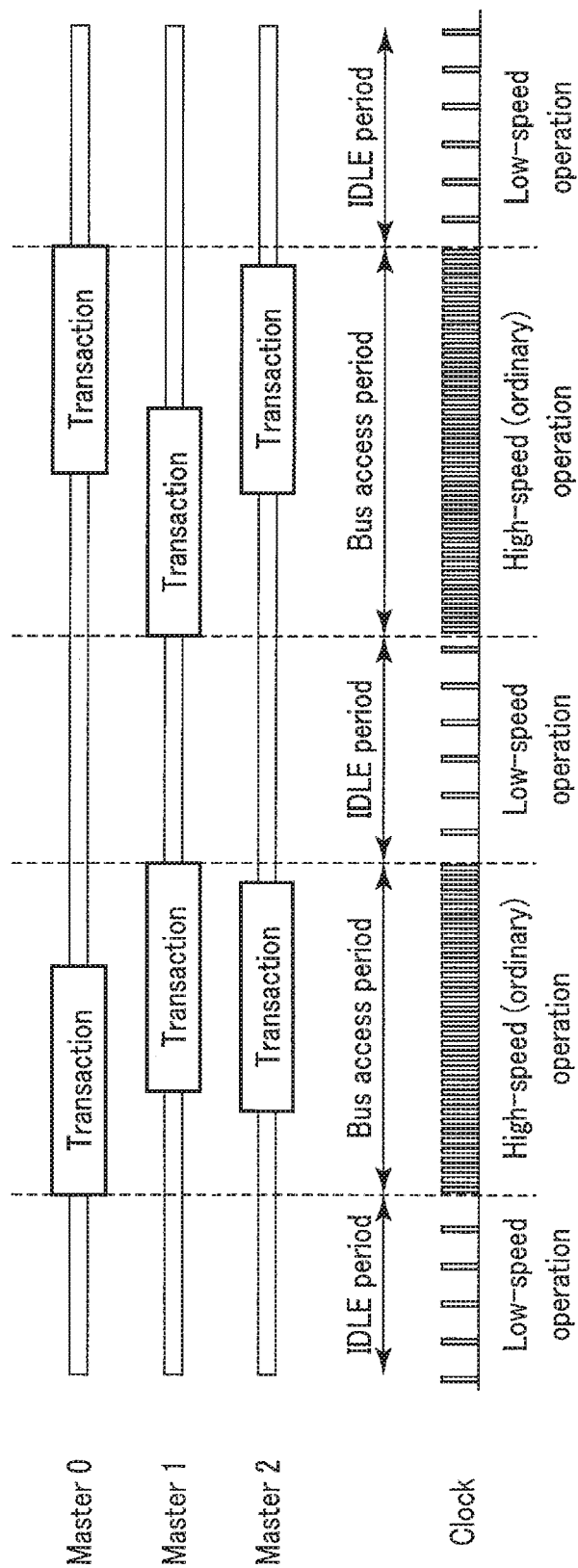
FIG. 7 is a time chart showing an example of an operation in which the clock frequency changes in accordance with the status of a transaction of each bus master.

FIG. 7 is a time chart showing an example of an operation in which the clock frequency changes in accordance with the status of a transaction of each bus master.

Here, an example in which the clock frequency changes in accordance with the status of each transaction of Master0, Master1, and Master2 are shown.

In an idle period (IDLE period) in which a transaction occurs in none of, for example, Master0, Master1, and Master2 as shown in FIG. 7, there is no need to hurriedly transfer data and so a low-speed operation slower than a normal operation is performed. Accordingly, power consumption is lowered.

To implement such an operation, the controller 6 sends a signal instructing the setting of the preset number of pulse masks to the pulse masking type frequency divider 2 and also sends an enable signal to the pulse masking type frequency divider 2. Accordingly, a clock in which the number of thinned-out pulses is large is generated by the pulse masking type frequency divider 2.

In a busy period (bus access period) in which a transaction occurs in at least one of Master0, Master1, and Master2, on the other hand, it is necessary to hurriedly transfer data and so a high-speed operation or a normal operation is performed. Incidentally, the operating speed (frequency) may change stepwise in accordance with the number of bus masters in which a transaction occurs.

To implement such an operation, the controller 6 sends a signal instructing the setting of 0 as the number of pulse masks or the setting of a number of pulse masks less than that in the IDLE period to the pulse masking type frequency divider 2 and also sends an enable signal the pulse masking type frequency divider 2. Accordingly, a clock in which no pulse is thinned out or the number of thinned-out pulses is small is generated by the pulse masking type frequency divider 2.

Based on such control, DFS control in units of transaction as a finer granularity that cannot be easily implemented by software can be implemented. Also, a power reduction effect is large because switching to a low-speed operation can swiftly be performed each time an IDLE period in which no transaction occurs arises. Also, the control can easily be implemented using a signal indicating the status of bus and therefore, implementation is made easier.

Next, some concrete examples are cited to describe the control.

Control Example (1a)

A control example in which the number of pulse masks is changed in accordance with the number of bus masters in an IDLE state will be described.

Information needed to exercise this control (such as information indicating the number of pulse masks corresponding to each state) is stored in the register 5 so that the information can be referenced by the controller 6.

Here, it is assumed that with an increasing number of bus masters in the IDLE state, the number of pulse masks is increased and the clock frequency is lowered.

In a period in which all of Master0, Master1, and Master2 are in an IDLE state, the controller 6 exercises control to mask, for example, 24 pulses among 32 pulses.

Also, in a period in which Master0 and Master1 are in an IDLE state and a transaction of Master2 occurs, the controller 6 exercises control to mask, for example, 12 pulses among 32 pulses.

Also, in a period in which a transaction occurs in Master0 and Master1, and Master2 is in an IDLE state, the controller 6 exercises control to mask, for example, four pulses among 32 pulses.

Control Example (1b)

A control example in which weights are assigned to each bus master accessing the bus in accordance with, for example, the degree of needed performance and the number of pulse masks is changed in accordance with the total of these weights will be described.

Information needed to exercise this control (such as information indicating the weight of each bus master and information indicating the number of pulse masks in accordance with the total number) is stored in the register 5 so that the information can be referenced by the controller 6.

Here, it is assumed that the weight of Master0 is 2, the weight of Master1 is 1, the weight of Master2 is 6, and with an increasing total of "(bus master accessing the bus)× (weight)", the number of pulse masks is decreased and the clock frequency is increased. Incidentally, the value of (bus master accessing the bus) is assumed to be, for example, 1 for each bus master.

The total is 0 in a period in which all of Master0, Master1, and Master2 are in an IDLE period. In this case, the controller 6 exercises control to mask, for example, 24 pulses among 32 pulses.

Also, the total is 6 in a period in which Master0 and Master1 are in an IDLE state and a transaction occurs in Master2. In this case, the controller 6 exercises control to mask four pulses among 32 pulses.

Also, the total is 3 in a period in which a transaction occurs in Master0 and Master1 and Master2 is in an IDLE state. In this case, the controller 6 exercises control to mask 12 pulses among 32 pulses.

Control Example (1c)

A control example in which a transaction of a specific bus master, for example, a transaction of Master2 is ignored in the control example (1b) described above will be described.

Information needed to exercise this control (such as information indicating that a transaction of Master2 is ignored) is stored in the register 5 so that the information can be referenced by the controller 6.

The total is 0 in a period in which all of Master0, Master1, and Master2 are in an IDLE period. In this case, the controller 6 exercises control to mask, for example, 24 pulses among 32 pulses.

The total is 0 in a period in which Master0 and Master1 are in an IDLE state and a transaction occurs in Master2. In this case, the controller 6 exercises control to mask 24 pulses among 32 pulses.

According to the first embodiment, with the configuration in which the pulse masking type frequency divider 2 is controlled by hardware in accordance with transaction occurrence conditions, the frequency can be switched in units of transaction and therefore, control of finer granularity can be implemented and a power saving effect can be enhanced.

Also, bus transactions can be monitored by using existing signals in existing activity monitor circuits and therefore, there is no need to implement a versatile and complex circuit and simple circuit implementation is sufficient and also incorporation into existing circuits is easy. Further, architecture unification for each product is easily achieved.

Also, automatic control is exercised by hardware without going through software and therefore, the number of man-hours to develop software can be reduced. Further, compared with control by software, control can be exercised in a finer granularity and therefore, a low power consumption operation can be performed.

Also, the timing design in a layout process is easy and risks such as an increased area and lower performance are low.

Also, thresholds, weights, and frequencies to be switched are variable and therefore, application to various products is easy.

Second Embodiment

Next, a second embodiment will be described.

The second embodiment will be described with reference to FIG. 1 described above and also FIGS. 8, 9A, and 9B.

Objects to be monitored in the second embodiment are memory units such as FIFO (hereinafter, abbreviated as "FIFO") present on a pathway on which data is supplied from DRAM or the like to a display or the like.

Figure 8:
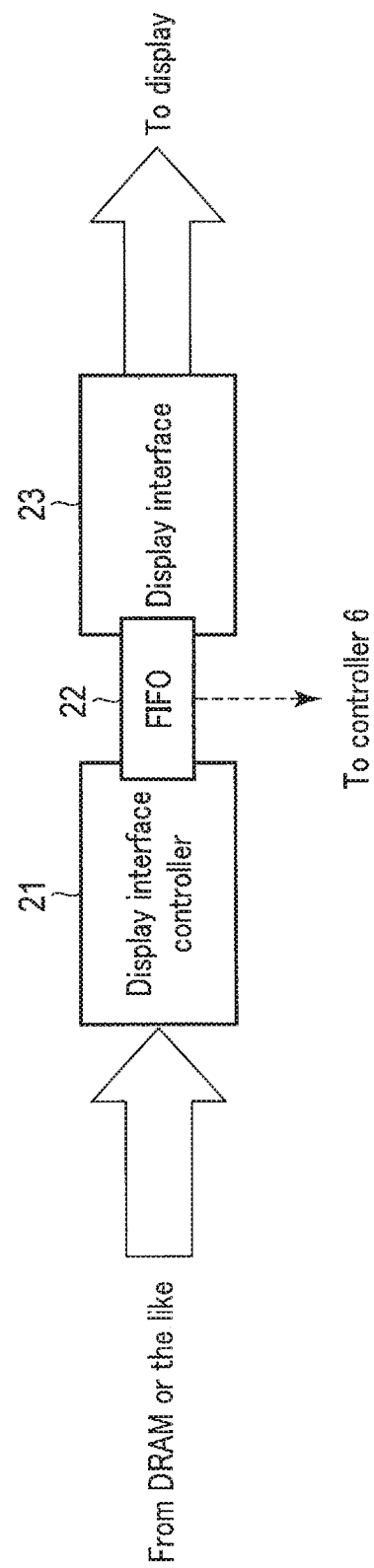
FIG. 8 is a conceptual diagram showing an example of the configuration showing FIFO and the like to be monitored in a second embodiment.

FIG. 8 is a conceptual diagram showing an example of the configuration showing FIFO and the like to be monitored in the second embodiment.

Incidentally, the configuration shown in FIG. 8 may be provided inside a semiconductor device 100 or a portion thereof may be provided outside the semiconductor device 100.

As shown in FIG. 8, a display interface controller 21, FIFO 22, and a display interface 23 are present on the pathway on which data is supplied from DRAM or the like to the display or the like. The FIFO 22 sequentially sends out data supplied from the display interface controller 21 to the display interface 23.

Depending on circumstances, there is much free space in queuing of the FIFO 22 or little free space. Information indicating such a queuing state of the FIFO 22 is transmitted to a controller 6 of a clock control module 10 through, for example, the activity monitor of a predetermined block in the semiconductor device 100. However, the pathway on which the information is transmitted is not limited to the above example. For example, information indicating the queuing state of the FIFO 22 may be transmitted to the controller 6 through another means.

Here, it is assumed that, for example, the available capacity of queuing of the FIFO 22 is monitored by an activity monitor A0 of a block B0 in the semiconductor device 100 and the monitoring result is transmitted to the controller 6.

The controller 6 changes the number of masks of pulses masked by a pulse masking type frequency divider 2 in accordance with the available capacity of queuing of the FIFO 22 shown in information transmitted from the activity monitor A0 to change the frequency of a divided frequency clock generated by the pulse masking type frequency divider 2.

Information such as the threshold to determine timing to transition to a low-speed operation or timing to transition to a high-speed operation (normal operation) is stored in a register 5. The information stored in the register 5 is referenced by the controller 6.

Figure 9A:
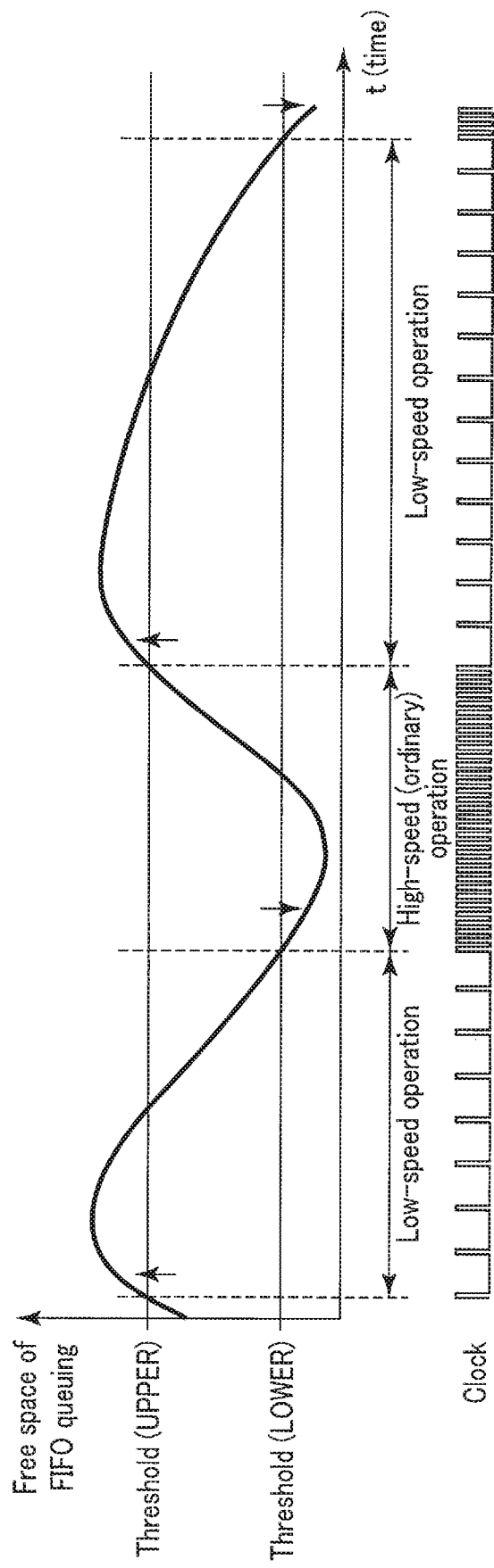
FIG. 9A is a time chart showing an example of an operation in which the clock frequency changes in accordance with a queuing state of FIFO.

FIG. 9A is a time chart showing an example of an operation in which the clock frequency changes in accordance with the queuing state of FIFO 22.

Here, an example in which the clock frequency changes in accordance with the available capacity of queuing of the FIFO 22 is shown.

If, for example, as shown in FIG. 9A, the available capacity of queuing of the FIFO 22 exceeds a first threshold (UPPER), free space of queuing is sufficient and there is no need to hurriedly transfer data and thus, a low-speed operation slower than the normal operation is started. Accordingly, power consumption is lowered.

To implement such an operation, after detecting that the available capacity of queuing of the FIFO 22 exceeds the first threshold (UPPER), the controller 6 sends a signal instructing the setting of the preset number of pulse masks to the pulse masking type frequency divider 2 and also sends an enable signal to the pulse masking type frequency divider 2. Accordingly, a clock in which the number of thinned-out pulses is large is generated by the pulse masking type frequency divider 2. Information needed to exercise this control (such as information indicating the first threshold (UPPER)) is stored in the register 5 so that the information can be referenced by the controller 6.

If, on the other hand, the available capacity of queuing of the FIFO 22 falls short of a second threshold (LOWER), free space of queuing is not sufficient and data needs to be transferred hurriedly and thus, a high-speed operation or the normal operation is started. Incidentally, the operating speed (frequency) may change stepwise in accordance with the available capacity of queuing.

To implement such an operation, after detecting that the available capacity of queuing of the FIFO 22 fails short of the second threshold (LOWER), the controller 6 sends a signal instructing the setting of 0 or the setting of the number of pulse masks smaller than that in an IDLE period to the pulse masking type frequency divider 2 and also sends an enable signal to the pulse masking type frequency divider 2. Accordingly, a clock in which no pulse is thinned out or the number of thinned-out pulses is small is generated by the pulse masking type frequency divider 2. Information needed to exercise this control (such as information indicating the second threshold (LOWER)) is stored in the register 5 so that the information can be referenced by the controller 6.

Next, another concrete example is cited to describe the control.

Control Example (2a)

Figure 9B:
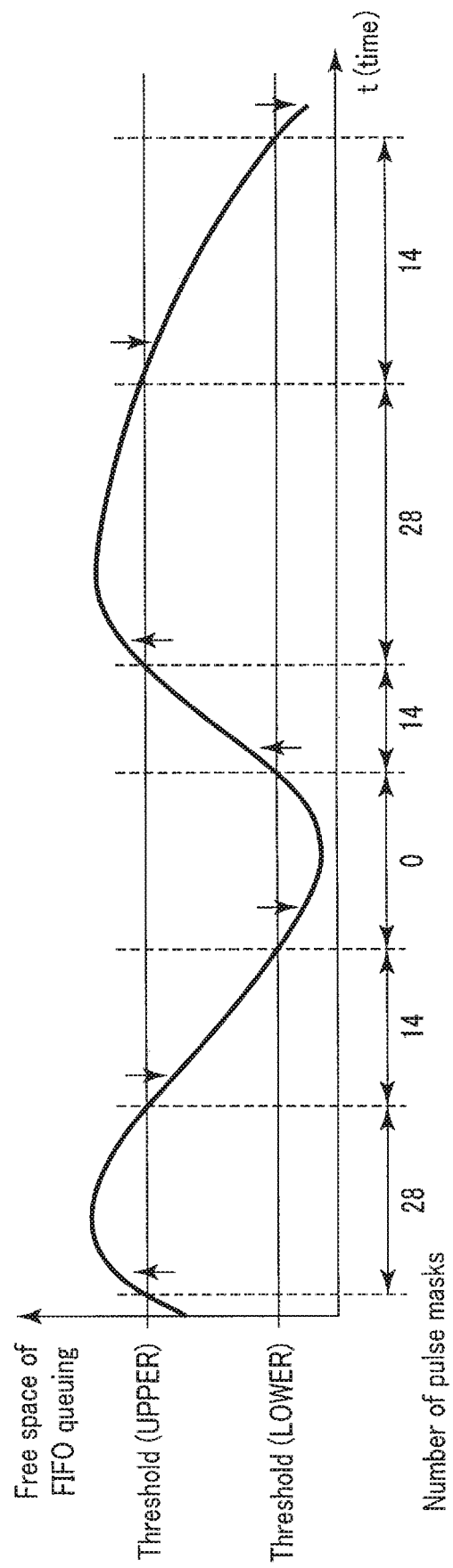
FIG. 9B is a time chart showing another concrete example of the operation in which the clock frequency changes in accordance with the queuing state of FIFO.

A control example in which the number of pulse masks is changed in three steps using the two thresholds will be described with reference to FIG. 9B.

Information needed to exercise this control (such as information indicating two thresholds) is stored in the register 5 so that the information can be referenced by the controller 6.

Here, it is assumed that with increasing free space of queuing of the FIFO 22, the number of pulse masks is increased and the clock frequency is lowered.

In a period in which the available capacity of queuing of the FIFO 22 exceeds the first threshold (UPPER), the controller 6 exercises control to mask, for example, 28 pulses among 32 pulses.

Also, in a period in which the available capacity of queuing of the FIFO 22 is between the first threshold (UPPER) and the second threshold (LOWER), the controller 6 exercises control to mask, for example, 14 pulses among 32 pulses.

Also, in a period in which the available capacity of queuing of the FIFO 22 falls short of the second threshold (LOWER), the controller 6 exercises control to mask, for example, 0 pulse (invalidate pulse masks) among 32 pulses.

Accordingly, finer control can be implemented. Incidentally, by setting three or more thresholds, instead of two thresholds, control may be exercised to change the number of pulse masks in more steps.

According to the second embodiment, an effect similar to that in the first embodiment can be achieved also by the configuration in which the controller 6 controls the pulse masking type frequency divider 2 in accordance with the queuing state of the FIFO 22.

Third Embodiment

Next, a third embodiment will be described.

The third embodiment will be described with reference to FIG. 1 described above and also FIGS. 10, 11A, and 11B.

Objects to be monitored in the third embodiment are the temperature of a predetermined location of a semiconductor device 100.

A temperature sensor (not shown) is provided in a predetermined location of the semiconductor device 100 shown in FIG. 1. The temperature sensor is used to detect the temperature of a predetermined location of the semiconductor device 100. Incidentally, the temperature sensor may be provided inside the semiconductor device 100 or outside the semiconductor device 100. Information indicating the temperature detected by the temperature sensor may be transmitted to a controller 6 directly or to the controller 6 through another means. For example, the temperature detected by the temperature sensor may be monitored by an activity monitor A0 of a block B0 in the semiconductor device 100 to transmit the monitoring result to the controller 6.

Here, it is assumed that information indicating the temperature detected by the temperature sensor is transmitted directly to the controller 6.

The controller 6 changes the number of masks of pulses masked by a pulse masking type frequency divider 2 in accordance with the value of temperature shown in information transmitted from the temperature sensor to change the frequency of a divided frequency clock generated by the pulse masking type frequency divider 2.

Information such as the threshold of temperature to determine timing to transition to a low-speed operation or timing to transition to a high-speed operation (normal operation) is stored in a register 5. The information stored in the register 5 is referenced by the controller 6.

Figure 10:
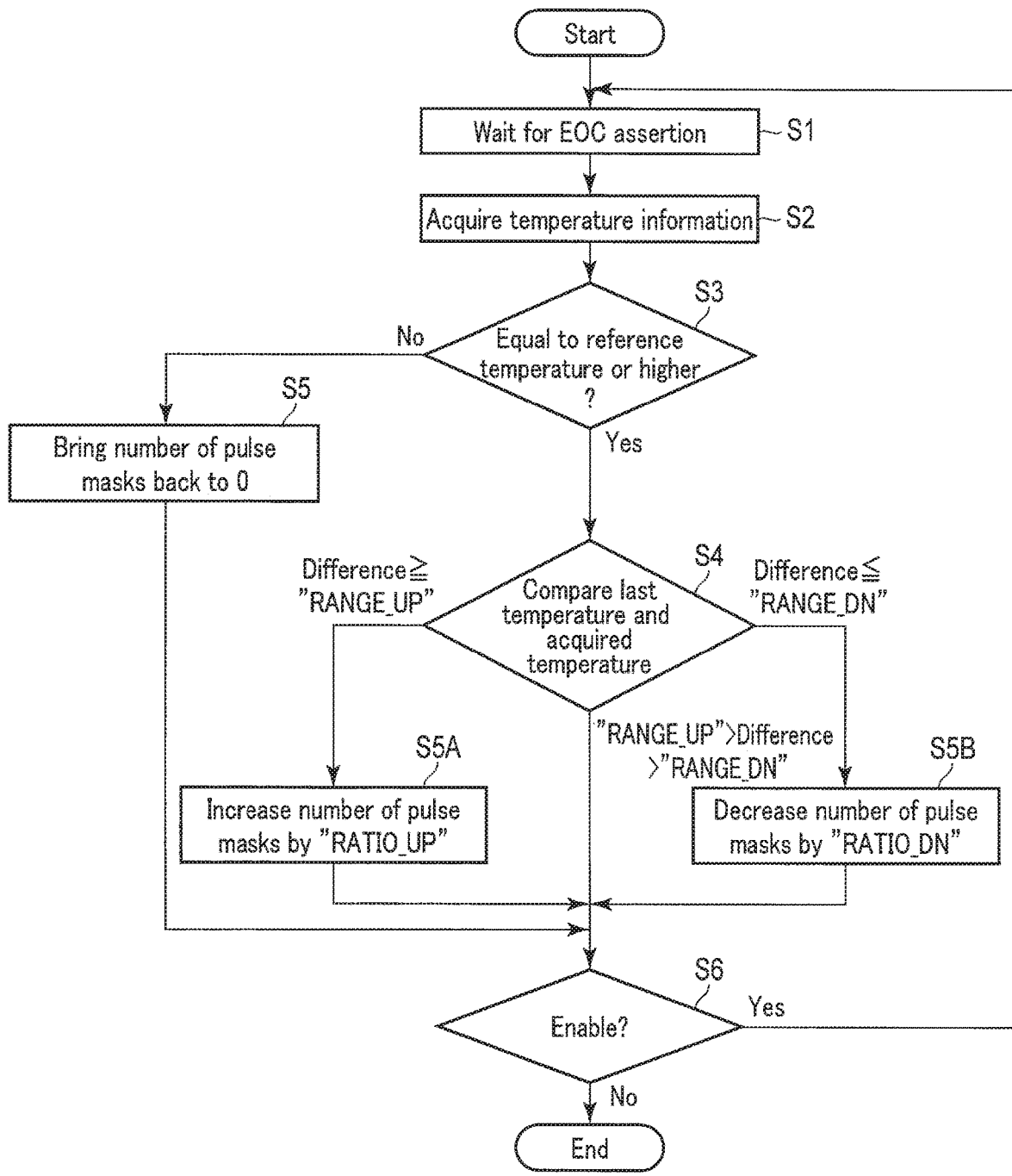
FIG. 10 is a flow chart showing an example of an operation by control in a third embodiment.

FIG. 10 is a flow chart showing an example of an operation by control in the third embodiment.

Here, a control example in which the number of mask pulses is changed in accordance with the amount of temperature change (a difference between the temperature acquired last time and the temperature acquired this time) per unit time will be described.

First, the controller 6 waits until an EOC (End Of Conversation) signal indicating the completion of temperature measurement from the temperature sensor is asserted while an enable signal to the pulse masking type frequency divider 2 is set to an ON state (step S1).

Next, in response to assertion of the SOC signal indicating the completion of temperature measurement, the controller 6 acquires temperature information and starts processing based on the acquired temperature (step S2).

The controller 6 compares the temperature acquired this time and the reference temperature preset to a register 5 to determine whether the temperature acquired this time is equal to the reference temperature or higher (step S3).

If the temperature acquired this time is equal to the reference temperature or higher (Yes in step S3), the processing proceeds to step 34. On the other hand, if the temperature acquired this time is lower than the reference temperature (No in step S3), the number of pulse masks is brought back to 0 (step S5) before proceeding to step S6.

In step S4, the controller 6 compares the temperature acquired last time and the temperature acquired this time (step S4).

More specifically, the controller 6 compares a difference between the temperature acquired this time and the temperature acquired last time and a first threshold (RANGE_UP) preset to the register 5 and also compares the difference between the temperature acquired this time and the temperature acquired last time and a second threshold (RANGE_DN) preset to the register 5.

If the difference between the temperature acquired this time and the temperature acquired last time is equal to the first threshold (RANGE_UP) preset to the register 5 or more, a fixed level of temperature rise in the unit time or more is assumed and the current number of pulse masks is increased by an amount of increase of the number of pulse masks (RAIO_UP) preset to the register 5 (step S5A) and also the clock frequency is lowered. Then, the processing proceeds to step S6.

On the other hand, if the difference between the temperature acquired this time and the temperature acquired last time is equal to the second threshold (RANGE_DN) preset to the register 5 or less, a fixed level or temperature fall in the unit time or more is assumed and the current number of pulse masks is decreased by an amount of increase of the number of pulse masks (RAID_DN) preset to the register 5 (step S5B) and also the clock frequency is raised. Then, the processing proceeds to step S6.

If the difference between the temperature acquired this time and the temperature acquired last time is between the first threshold (RANGE_UP) and the second threshold (RANGE_DN), the processing proceeds to step S6 without changing the number of pulse masks.

Lastly, the controller 6 checks the status of the enable signal (step S6). The controller 6 repeats the processing starting with step S1 as long as the enable signal is turned on. On the other hand, when the enable signal is turned off, the controller 6 terminates the control.

In the above operation, the control may also be modified and exercised according to the definition of a table preset to the register 5 in which definitions are provided such as specifying X pulse masks at x° C., specifying Y pulse masks at y° C. and the like.

FIGS. 11A and 11B are conceptual diagrams showing differences of temperature changes and performance changes implemented by the control according to the third embodiment and control by general technology in comparison.

FIG. 11A shows an example of temperature changes and performance changes implemented by the control of general technology. On the other hand, FIG. 11B shows an example of temperature changes and performance changes implemented by the control according to the third embodiment.

In FIGS. 11A and 11B, reference sign T1 indicates temperature changes implemented by the control of general technology and reference sign T2 indicates temperature changes implemented by the control according to the present embodiment. Also, reference sign P1 indicates performance changes implemented by the control of general technology and reference sign P2 indicates performance changes implemented by the control according to the present embodiment.

In the control of general technology shown in FIG. 11A, when the temperature rises, the clock frequency is significantly lowered stepwise by dividing the clock using a general frequency divider. Accordingly, the performance of device also deteriorates significantly stepwise.

A general frequency divider cannot exercise finer frequency control in accordance with the rise of temperature and so is forced to exercise coarse frequency control. Therefore, the effect of suppressing the rise of temperature is small as shown by the temperature changes T1 and also the degradation of performance is large as shown by the performance changes P1.

In the control according to the third embodiment shown in FIG. 11B, by contrast, when the temperature rises, the clock frequency is gradually lowered by finely changing the number of pulse masks of the pulse masking type frequency divider 2 each time, for example, the amount of temperature change in the unit time exceeds a fixed amount. Accordingly, the performance of device also deteriorates gradually.

In the third embodiment, fine frequency control can be exercised by the pulse masking type frequency divider 2 in accordance with the rise of temperature. Therefore, the rise of temperature can effectively be suppressed as shown by the temperature changes T2 and also the degradation of performance can be suppressed as shown by the performance changes P2.

Fourth Embodiment

Next, a fourth embodiment will be described.

The fourth embodiment will be described with reference to FIG. 1 described above and also FIG. 12.

Objects to be monitored in the fourth embodiment are operation modes of a semiconductor device 100 shown in FIG. 1.

The operation mode of the semiconductor device 100 is monitored by, for example, an activity monitor A2 of a block B2 in the semiconductor device 100 and the monitoring result is transmitted to a controller 6.

The controller 6 changes the number of masks of pulses masked by a pulse masking type frequency divider 2 in accordance with the transition of the operation mode shown in information transmitted from the activity monitor A2 to change the frequency of a divided frequency clock generated by the pulse masking type frequency divider 2.

Information of a table in which the number of pulse masks corresponding to each of individual operation modes is defined is stored in a register 5. The information stored in the register 5 is referenced by the controller 6.

Figure 12:
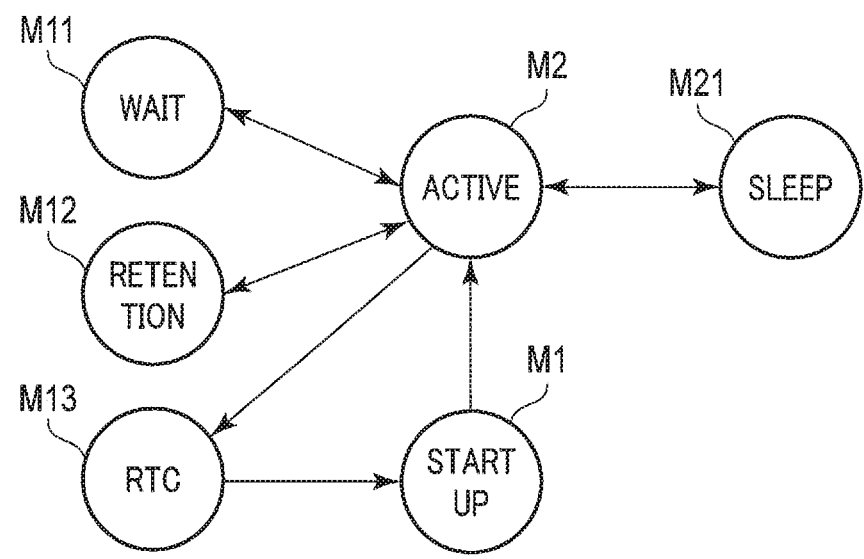
FIG. 12 is a conceptual diagram showing an example of the transition of operation modes to be monitored in a fourth embodiment.

FIG. 12 is a conceptual diagram showing an example of the transition of operation modes to be monitored in the fourth embodiment.

As shown in FIG. 12, operation modes of the semiconductor device 100 include, for example, a startup mode M1 and an active mode M2 and also a wait mode M11, a retention mode M12, an RTC mode M13, and a sleep mode M21.

The startup mode M1 can transition to the active mode M2.

The active mode M2 can transition to any of the wait mode M11, the retention mode M12, the RTC mode M13, and the sleep mode M21.

The wait mode M11 can transition to the active mode M2. The retention mode M12 can transition to the active mode M2. The RTC mode M13 can transition to the startup mode M1.

The sleep mode M21 can transition to the active mode M2.

The CPU is in a deep sleep state in the wait mode M11, the retention mode M12, or the RTC mode M13. In this case, the CPU is stopped and there is no need of high-speed return. Therefore, the clock can be stopped from the supply source (a PLL circuit 1 can also be stopped). In this case, the controller 6 in FIG. 1 does not need to control the settings of the number of pulse masks of the pulse masking type frequency divider 2 and the like.

In the sleep mode M21, on the other hand, the CPU is in a sleep state. In this case, the CPU is stopped, but a high-speed return is needed. Thus, in consideration of the return time, the supply source of the clock needs to keep operating (the PLL circuit 1 also needs to keep operating). In this case, there is no need to set the operation rate to 100%. Thus, the controller 6 in FIG. 1 lowers the clock frequency by setting the number of pulse masks of the pulse masking type frequency divider 2 to, for example, a value larger than the number of pulse masks in the active mode M2 to reduce power consumption.

In the fourth embodiment, power consumption can further be reduced by lowering the clock frequency to a desired value by the pulse masking type frequency divider 2 in a mode in which there is no need to set the operation rate to 100% such as the CPU sleep mode.

According to the embodiments, as described above in detail, a clock of a desired frequency can immediately be generated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made. The accompanying claims and their equivalents are intended to cover such forms or modifications as would fall within the scope of the inventions.

The invention claimed is:

1. A clock generator comprising:
   a frequency divider which generates a divided frequency clock of a frequency lower than a frequency of a source clock by performing mask processing on part of a pulse train of the source clock;
   wherein the frequency divider selectively generates the divided frequency clock by selectively using one of a plurality of different bit string patterns stored in a memory to mask the pulse train of the source clock at fixed periods, wherein the plurality of bit strings mask different numbers of pulses of the pulse train.

2. The clock generator according to claim 1, wherein the frequency divider switches the frequency of the divided frequency clock to be generated by switching the bit string pattern to be used.

3. The clock generator according to claim 2, wherein the frequency divider switches the bit string pattern to be used under control of predetermined hardware.

4. The clock generator according to claim 1, further comprising a controller that changes the frequency of the divided frequency clock generated by the frequency divider in accordance with a status change of a certain object.

5. The clock generator according to claim 4, wherein the controller changes the frequency of the divided frequency clock generated by the frequency divider in accordance with an occurrence of one or a plurality of transactions.

6. The clock generator according to claim 4, wherein the controller changes the frequency of the divided frequency clock generated by the frequency divider in accordance with an available capacity of a memory that sends data to a predetermined device.

7. The clock generator according to claim 4, wherein the controller changes the frequency of the divided frequency clock generated by the frequency divider in accordance with a temperature in a predetermined location.

8. The clock generator according to claim 4, wherein the controller changes the frequency of the divided frequency clock generated by the frequency divider in accordance with a transition of an operation mode.

9. A clock generation method comprising:
preparing a plurality of different bit string patterns which mask different numbers of pulses of a pulse train of a source clock at fixed periods, and storing the plurality of different bit string patterns in a memory;
inputting the source clock into a frequency divider;
selecting one of the plurality of bit string patterns from the memory; and
generating a divided frequency clock of a frequency lower than a frequency of the source clock by the frequency divider by performing mask processing on part of the pulse train of the source clock using the selected bit string pattern.

10. The clock generation method according to claim 9, further comprising:
switching the frequency of the divided frequency clock to be generated by the frequency divider by switching the bit string pattern to be used.

* * * * *